United States Patent
Kubo et al.

(10) Patent No.: US 8,495,475 B2
(45) Date of Patent: Jul. 23, 2013

(54) FEC FRAME STRUCTURING DEVICE AND FEC FRAME STRUCTURING METHOD

(75) Inventors: Kazuo Kubo, Tokyo (JP); Takashi Mizuochi, Tokyo (JP); Takashi Sugihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 511 days.

(21) Appl. No.: 12/767,120

(22) Filed: Apr. 26, 2010

(65) Prior Publication Data

US 2010/0287449 A1 Nov. 11, 2010

(30) Foreign Application Priority Data

May 11, 2009 (JP) ................................. 2009-114552

(51) Int. Cl.
*G06F 11/00* (2006.01)

(52) U.S. Cl.
USPC .......................................... 714/776; 714/775

(58) Field of Classification Search
USPC .................... 714/752, 775, 776, 786
See application file for complete search history.

(56) References Cited

U.S. PATENT DOCUMENTS

| | | | |
|---|---|---|---|
| 6,868,514 B2 | 3/2005 | Kubo et al. | |
| 7,028,241 B1 * | 4/2006 | Blair et al. | 714/752 |
| 7,043,162 B2 | 5/2006 | Kubo et al. | |
| 7,058,090 B1 * | 6/2006 | Player et al. | 370/536 |
| 7,278,081 B1 * | 10/2007 | Blair et al. | 714/752 |
| 7,289,530 B1 | 10/2007 | Yuan et al. | |
| 7,440,475 B2 | 10/2008 | Kubo et al. | |
| 7,689,133 B2 * | 3/2010 | Katagiri et al. | 398/204 |
| 8,274,892 B2 * | 9/2012 | Chiang et al. | 370/235 |
| 2005/0286521 A1 * | 12/2005 | Chiang et al. | 370/389 |
| 2008/0092009 A1 | 4/2008 | Miyata et al. | |
| 2008/0148127 A1 | 6/2008 | Miyata et al. | |
| 2008/0279553 A1 | 11/2008 | Meagher et al. | |
| 2009/0063889 A1 | 3/2009 | Dada et al. | |
| 2011/0296270 A1 * | 12/2011 | Lim et al. | 714/752 |

FOREIGN PATENT DOCUMENTS

JP 2009-89194 4/2009

OTHER PUBLICATIONS

Herbert Haunstein, Optische Übertragungstechnik für 100Gbit/s (Optical Transmission Technology for 100Gb/s), XP002602545, Alcatel—Lucent, Jul. 2, 2008, pp. 1-34.
Tony Breach, "40G and 100G Overview", NORDUnet A/S, Version No. 1.0, XP 002602547, Mar. 20, 2009, pp. 1-18.

(Continued)

*Primary Examiner* — Bryce Bonzo
*Assistant Examiner* — Elmira Mehrmanesh
(74) *Attorney, Agent, or Firm* — Oblon, Spivak, McClelland, Maier & Neustadt, L.L.P.

(57) ABSTRACT

An FEC frame structuring device includes a multi-lane distributing unit that distributes a data frame to be transmitted to n lanes, FEC coding units each performs FEC coding of the distributed data frame independently for each of the n lanes to generate an FEC frame, a multiplexing unit that multiplexes the FEC frame from the FEC coding units by relating to m channels of an optical signal, a demultiplexing unit that demultiplexes the m channels of the received optical signal by relating to the n lanes, FEC decoding units each performs FEC decoding of the demultiplexed FEC frame independently for each of the n lanes, and a multi-lane synchronizing unit that synchronizes the n lanes with each other after the FEC decoding performed by the FEC decoding units to reconstruct the original data frame.

13 Claims, 9 Drawing Sheets

OTHER PUBLICATIONS

Partial Search Report issued Nov. 12, 2010, in European Patent Application No. 10004451.0-1247.

"Series G: Transmission Systems and Media, Digital Systems and Networks—Digital terminal equipments—General. Series Y: Global Information Infrastructure, Internet Protocol Aspects and Next Generation Networks—Internet protocol aspects—Transport." Interfaces for the Optical Transport Network (OTN), ITU-T G.709/Y.1331. Mar. 2003. 117 pages.

Karl Gass, et al. "Very Short Reach Interface Level 5 (VSR-5): SONET/SDH OC-768 Interface for Very Short Reach (VSR) applications," Implementation Agreement OIF-VSR5-01.0, VSR-5. Sep. 2002, pp. 1-76.

Yoshikuni Miyata, et al., "Proposal for Frame Structure of Optical Channel Transport Unit Employing LDPC Codes for 100 Gb/s FEC", Proc. Optical Fiber Communication Conf./National Fiber Optic Engineers Conf., 2009, 3 pages.

Yoshikuni Miyata, et al., "Efficient FEC for Optical Communications using Concatenated Codes to Combat Error-floor", OFC/NFOEC, 2008, 3 pages.

Office Action issued Aug. 25, 2011 in Europe Application No. 10 004 451.0.

Chinese Office Action issued Sep. 28, 2012, in China Patent Application No. 201010180140.3 (with English translation).

Office Action mailed May 21, 2013, in Japanese Patent Application No. 2009-114552 (with partial English Translation).

Kobayashi, T. et al., "Soft Decision LSI Operating at 32 Gsample/s for LDPC FEC-based Optical Transmission Systems" Optical Fiber Communication-includes post deadline papers, 2009. OFC 2009. Conference on May 2009, 4 pages.

"Series G: Transmission Systems and Media, Digital Systems and Networks- Digital terminal equipments- General. Series Y: Global Information Infrastructure, Internet Protocol Aspects and Next Generation Networks- Internet protocol aspects-Transport." Interfaces for the Optical Transport Network (OTN), ITU-T G.709/Y.1331 Amendment 3, Apr. 2009, pp. 2, 9, 12, 48-51, and 55-58.

* cited by examiner

| | | | ROTATE | | | ROTATE | | | ROTATE | | |
|---|---|---|---|---|---|---|---|---|---|---|---|
| LANE 0 | 1:16(FA) | ... | 305:320 | 16001:16016 | ... | 33:48 | 16033:16048 | ... | 17:32 | 16017:16032 | ... | 1:16(FA) |
| LANE 1 | 17:32 | ... | 1:16(FA) | 16017:16032 | ... | 49:64 | 16049:16064 | ... | 33:48 | 16033:16048 | ... | 17:32 |
| ... | | | | | | | | | | | |
| LANE 18 | 289:304 | ... | 273:288 | 16289:16304 | ... | 1:16(FA) | 16001:16016 | ... | 305:320 | 16305:16320 | ... | 289:304 |
| LANE 19 | 305:320 | ... | 289:304 | 16305:16320 | ... | 17:32 | 16017:16032 | ... | 1:16(FA) | 16001:16016 | ... | 305:320 |

FIG.5B

| | | | ROTATE | | | ROTATE | | | ROTATE | | |
|---|---|---|---|---|---|---|---|---|---|---|---|
| LANE 0 | 1:16(FA) | ... | 305:320 | 17921:17936 | ... | 33:48 | 17953:17968 | ... | 17:32 | 17935:17952 | ... | 1:16(FA) |
| LANE 1 | 17:32 | ... | 1:16(FA) | 17935:17952 | ... | 49:64 | 17969:17984 | ... | 33:48 | 17953:17968 | ... | 17:32 |
| ... | | | | | | | | | | | |
| LANE 18 | 289:304 | ... | 273:288 | 18209:18224 | ... | 1:16(FA) | 17921:17936 | ... | 305:320 | 18225:18240 | ... | 289:304 |
| LANE 19 | 305:320 | ... | 289:304 | 18225:18240 | ... | 17:32 | 17937:17952 | ... | 1:16(FA) | 17921:17936 | ... | 305:320 |

FEC FRAME STRUCTURING DEVICE AND FEC FRAME STRUCTURING METHOD

BACKGROUND OF THE INVENTION

1. Field of the Invention

The present invention relates to a frame structuring device and a frame structuring method in which FEC (Forward Error Correction) applied to a digital communication device such as an optical communication system is used.

2. Description of the Related Art

In conventional FEC frame structuring devices and methods, a method in which a Reed-Solomon (RS) error correction code is used in an OTUk (Optical channel Transport Unit-k) frame is applied (see, for example, ITU-T Recommendation G.709).

Another method is also proposed in which an OTUk frame is distributed to four lanes by using a 64B/66B transmission code so as to be transmitted by an optical interface including four wavelengths (see, for example, OIF-VSR5-01.0).

In the conventional FEC frame structuring devices and methods, the method using an OTUk frame assumes an optical interface of one wavelength and thus cannot handle optical interface including a plurality of lanes. Furthermore, although the method using the 64B/66B code can distribute an OTUk frame to plural lanes independently of any FEC frame, this causes an undesired increase in a processing speed by about 3%. Accordingly, power consumption and circuit scale are increased and transmission characteristics are deteriorated.

The present invention has been achieved to solve the above problems, and it is an object of the present invention to realize an FEC frame structuring device and an FEC frame structuring method that can handle optical interface including plural lanes and prevent an unnecessary increase in the processing speed that can be a factor of deteriorated transmission characteristics, to thereby provide a high-quality and high-speed optical communication system.

SUMMARY OF THE INVENTION

In order to solve the aforementioned problems, a forward error correction (FEC) frame structuring device in a communication system that transmits or receives an FEC frame structured by adding an FEC code to a data frame including information data and an overhead as an optical signal is structured in such a manner that it includes: a multi-lane distributing unit that distributes a data frame to be transmitted to n (n is a positive integer) lanes; n FEC coding units that each perform FEC coding of the data frame distributed by the multi-lane distributing unit independently with respect to each of the n lanes to generate an FEC frame; a multiplexing unit that multiplexes the FEC frame from the n FEC coding units to be related to m (m is a positive integer) channels for the optical signal; a demultiplexing unit that demultiplexes the m channels of the received optical signal to be related to the n lanes; n FEC decoding units that each perform FEC decoding of the FEC frame demultiplexed by the demultiplexing unit independently with respect to each of the n lanes; and a multi-lane synchronizing unit that synchronizes the n lanes after the FEC decoding performed by the n FEC decoding units to reconstruct the original data frame, wherein n is dividable by m.

According to another aspect of the present invention, an FEC frame structuring device includes: an FEC coding unit that performs FEC coding of the OTUk frame to be transmitted by providing an additional redundant area added thereto, to generate the FEC frame; a multi-lane distributing unit that distributes the FEC frame generated by the FEC coding unit to n (n is a positive integer) lanes; a multiplexing unit that multiplexes the FEC frame distributed to the n lanes by the multi-lane distributing unit by relating to m (m is a positive integer) channels for the optical signal; a demultiplexing unit that demultiplexes the m channels for the received optical signal by relating to the n lanes; a multi-lane synchronizing unit that synchronizes the n lanes demultiplexed by the demultiplexing unit to reconstruct the FEC frame; and an FEC decoding unit that performs FEC decoding of the FEC frame reconstructed by the multi-lane synchronizing unit, wherein n is dividable by m.

According to further aspect of the present invention, a method of structuring an FEC frame in an optical communication system that transmits or receives an FEC frame structured by adding an FEC code to a data frame including information data and an overhead as an optical signal includes the steps of: multi-lane distributing for distributing a data frame to be transmitted to n (n is a positive integer) lanes; FEC coding for performing FEC coding of the data frame distributed at the multi-lane distributing step independently for each of the n lanes to generate an FEC frame; multiplexing for multiplexing the FEC frame from the n FEC coding units by relating to m (m is a positive integer) channels for the optical signal; demultiplexing for demultiplexing the m channels of the received optical signal by relating to the n lanes; FEC decoding for performing FEC decoding of the FEC frame demultiplexed at the demultiplexing step independently for each of the n lanes; and multi-lane synchronizing for synchronizing the n lanes after the FEC decoding performed at the n FEC decoding step to reconstruct the original data frame, wherein n is dividable by m.

According to still further aspect of the present invention, an FEC frame structuring method includes: performing FEC coding of the OTUk frame to be transmitted by providing an additional redundant area added thereto, to generate the FEC frame; distributing the FEC frame generated at the FEC coding to n (n is a positive integer) lanes; multiplexing the FEC frame distributed to the n lanes at the distributing to be related to m (m is a positive integer) channels for the optical signal; demultiplexing the m channels for the received optical signal to be related to the n lanes; synchronizing the n lanes demultiplexed at the demultiplexing to reconstruct the FEC frame; and performing FEC decoding of the FEC frame reconstructed at the synchronizing, wherein n is dividable by m.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
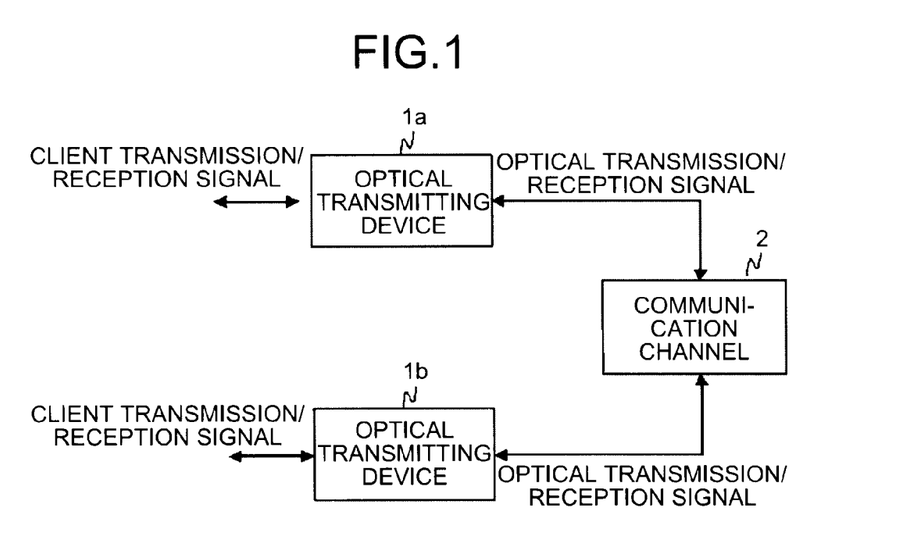
FIG. 1 is a configuration diagram of an optical communication system that uses an FEC frame structuring device according to a first embodiment of the present invention.

FIG. 1 is a configuration diagram of a digital communication system (hereinafter, referred to just as an "optical communication system") that uses an FEC frame structuring device according to a first embodiment of the present invention. In the following drawings, like reference numerals denote like or corresponding units. As shown in FIG. 1, optical transmitting devices 1a and 1b perform interconversion of a client transmission/reception signal and an optical transmission/reception signal, such as mapping or demapping of a client signal and an optical transmission frame, error correction coding or decoding, and electrical/optical conversion, so as to provide bidirectional communications between the optical transmitting devices 1a and 1b through a communication channel 2.

Figure 2:
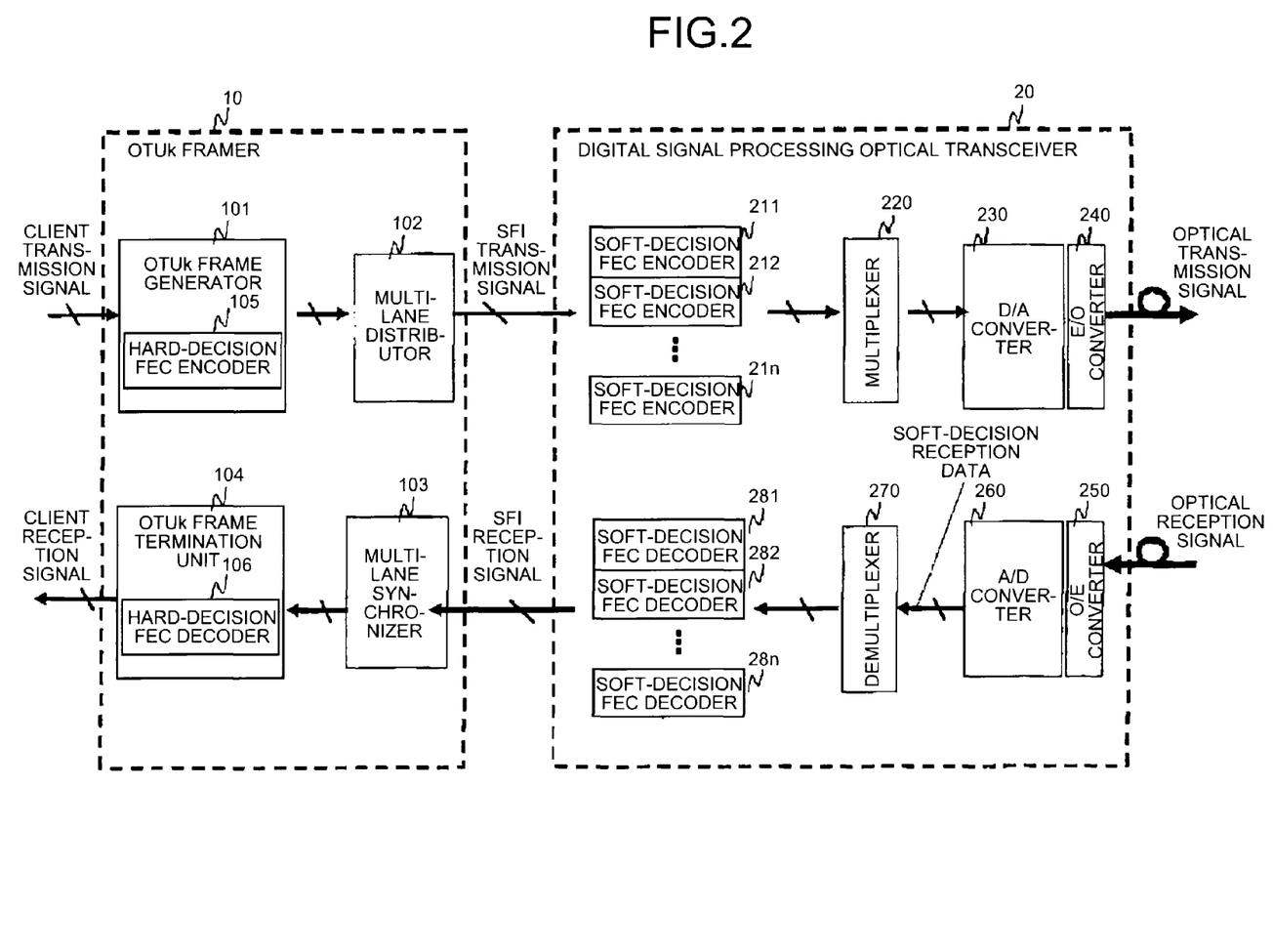
FIG. 2 is a configuration diagram of the FEC frame structuring device according to the first embodiment.

FIG. 2 is a detailed configuration diagram of the optical transmitting device 1a or 1b shown in FIG. 1. As shown in FIG. 2, an OTUk framer 10 includes an OTUk frame generator 101 that performs mapping of a client transmission signal to an OTUk frame as a data frame, generates an optical transmission frame by adding information required for frame synchronization and/or maintenance control to the OTUk frame, and outputs the thus generated optical transmission frame to a multi-lane distributor 102, the multi-lane distributor 102 that distributes the OTUk frame to plural lanes and outputs a serdes framer interface (SFI) transmission signal to a digital signal processing optical transceiver 20, a multi-lane synchronizer 103 that synchronizes an SFI reception signal from the digital signal processing optical transceiver 20 among the plural lanes and outputs the OTUk frame to an OTUk frame termination unit 104, and the OTUk frame termination unit 104 that terminates the information required for the frame synchronization and/or maintenance control in the OTUk frame, performs demapping of a client reception signal from the OTUk frame, and outputs the demapped client reception signal. The OTUk frame generator 101 includes a hard-decision FEC encoder 105, and the OTUk frame termination unit 104 includes a hard-decision FEC decoder 106.

In FIG. 2, the digital signal processing optical transceiver 20 includes soft-decision FEC encoders 211 to 21n, which are n (n is a positive integer) FEC coding units encoding the SFI transmission signal from the OTUk framer 10 for each of the lanes by using an error correction code for soft decision, a multiplexer 220 that multiplexes outputs from the soft-decision FEC encoders 211 to 21n and outputs a result to a digital/analog (D/A) converter 230, the D/A converter 230 that performs D/A conversion of the output signal from the multiplexer 220, an electrical/optical (E/O) converter 240 that converts the analog signal from the D/A converter 230 into an optical signal and outputs an optical transmission signal to the communication channel 2, an optical/electrical (O/E) converter 250 that converts an optical reception signal from the communication channel 2 into an analog signal, an analog/digital (A/D) converter 260 that converts the analog signal into soft-decision reception data of q bits, a demultiplexer 270 that demultiplexes the soft-decision reception data of q bits and outputs the q-bit soft-decision reception data corresponding to each of the lanes to soft-decision FEC decoders 281 to 28n, and the soft-decision FEC decoders 281 to 28n, which are n FEC decoding units that perform soft-decision decoding of the soft-decision reception data of q bits for each lane, correct errors, and output an SFI reception signal to the OTUk framer 10.

Figure 3:
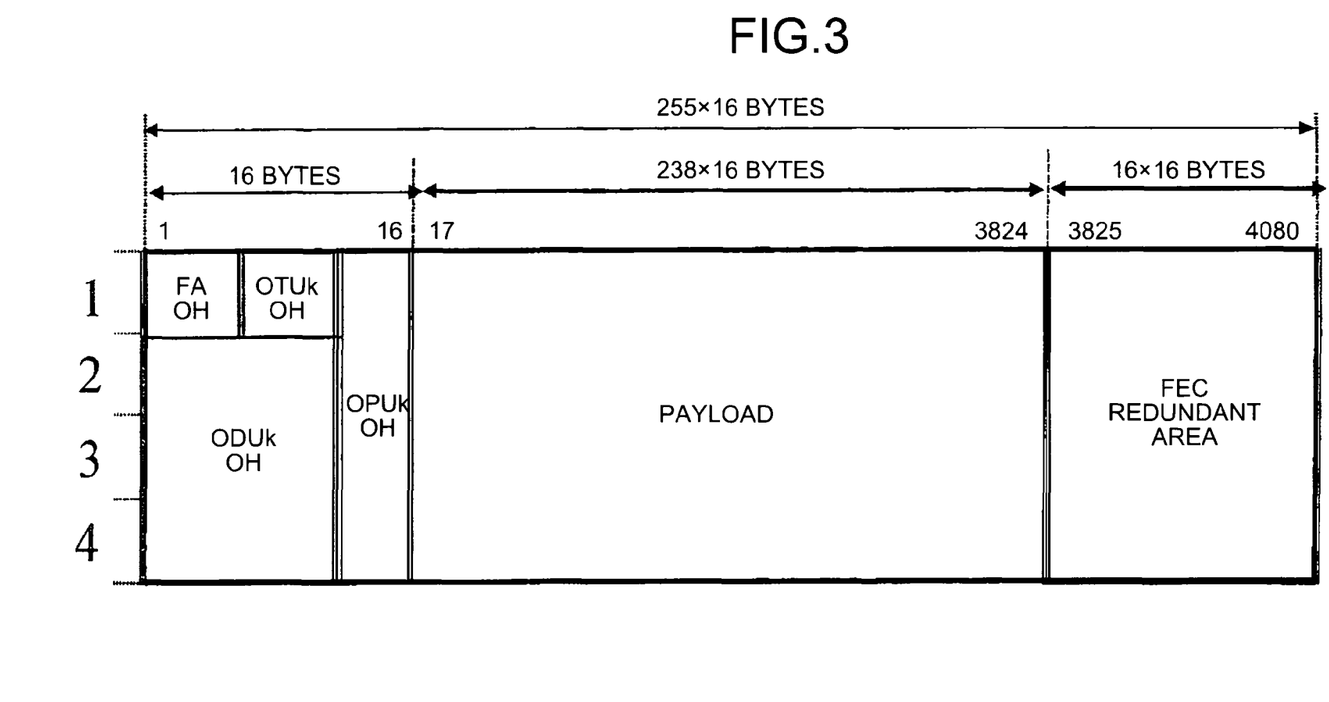
FIG. 3 is a schematic diagram for explaining the FEC frame structuring device according to the first embodiment.

FIG. 3 is a configuration diagram of an OTUk frame defined in ITU-T Recommendation G.709, for example. As shown in FIG. 3, an OTUk frame includes a payload for storing therein practical information data such as a client signal, a frame alignment overhead (FA OH) for frame synchronization, an OTUk OH and an optical channel data unit-k overhead (ODUk OH) for maintenance and monitor information, and an optical channel payload unit-k overhead (OPUk OH) for payload mapping. The OTUk frame further includes an FEC redundant area for storing therein information of an error correction code for correcting bit errors caused due to deterioration in an optical quality after transmission. A Reed-Solomon code (hereinafter, "RS code") (255, 239) is usually used for the error correction code. A portion composed of the FA OH, the OTUk OH, the ODUk OH, and the OPUk OH is generally called overhead.

In this way, the optical communication system forms a transmission frame by adding an overhead and an error correction code to a payload as information data to be practically transmitted, and then transmits the thus formed transmission frame at a high speed and over a long distance.

Figure 4A:
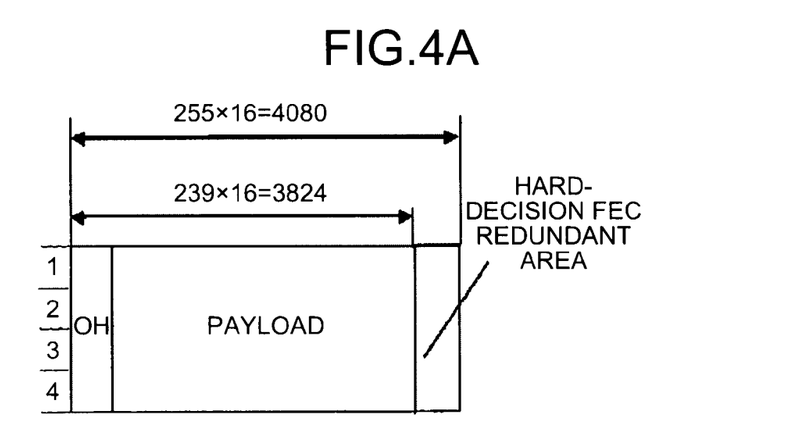
FIGS. 4A and 4B are schematic diagrams for explaining the FEC frame structuring device according to the first embodiment.
Figure 4B:
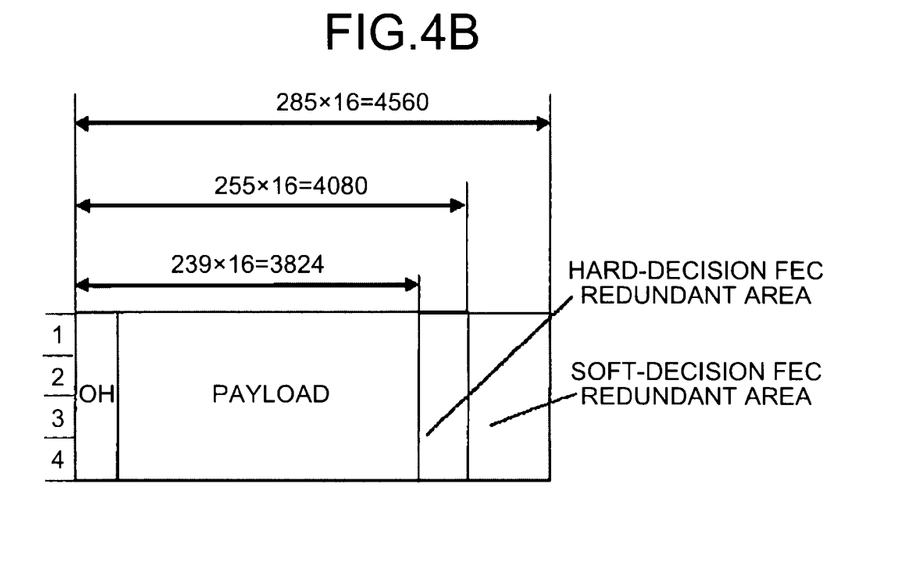

An operation of the first embodiment is explained with reference to FIGS. 4A and 4B. FIG. 4A depicts a configuration of a transmission frame as a data frame to be outputted from the OTUk frame generator 101. FIG. 4B depicts a configuration of a transmission frame as an FEC frame to be outputted from the soft-decision FEC encoders 211 to 21n, in which a soft-decision FEC redundant area is added to the transmission frame as shown in FIG. 4A. The OTUk frame generator 101 first performs mapping of a client transmission signal to a payload shown in FIG. 4A and adds various types of overhead information to an OH. The hard-decision FEC encoder 105 performs error correction coding as an external code and stores error correction code information in a hard-decision FEC redundant area. The hard-decision FEC encoder 105 performs encoding with an RS code or a Bose-Chaudhuri-Hocquenghem (BCH) code, for example. The soft-decision FEC encoders 211 to 21n then perform error correction coding for soft-decision decoding with an internal code and stores error correction code information in the soft-decision FEC redundant area shown in FIG. 4B. Examples of error correction codes for soft decision are a low-density parity-check (LDPC) code, a block turbo code, and a convolutional code.

Figure 5A:
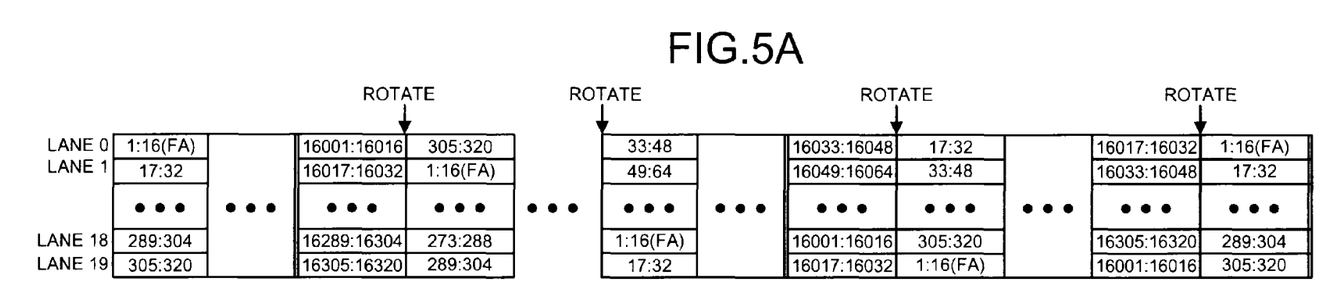
FIGS. 5A and 5B are schematic diagrams for explaining the FEC frame structuring device according to the first embodiment.

FIG. 5A depicts a configuration of a transmission frame in an SFI transmission signal or an SFI reception signal exchanged between the OTUk framer 10 and the digital signal processing optical transceiver 20, in which the OTUk frame shown in FIG. 3 is distributed to lanes 0 (zero) to 19. The multi-lane distributor 102 distributes the OTUk frames to each of the lanes in units of 16 bytes. With respect to a first OTUk frame, first 16 bytes including an FA OH (1:16 (FA)) are distributed to the lane 0, and next 16 bytes (17:32) are distributed to the lane 1. Remaining bytes are similarly distributed to the lanes 2 to 19 in units of 16 bytes, respectively. With respect to a second OTUk frame, lanes to which bytes of the frame are distributed are rotated by one lane, so that first 16 bytes including an FA OH (1:16 (FA)) are distributed to the lane 1, next 16 bytes (17:32) are distributed to the lane 2, and remaining bytes are similarly distributed to the lanes 3 to 19 and to lane 0 in units of 16 bytes, respectively. In this way, lanes to which bytes of a frame are distributed are rotated by one lane with respect to each frame and loop back in a 20th frame.

The number of lanes does not indicate a physical number of signal lines for the SFI transmission signal and the SFI reception signal but indicates a logical number of lanes. An example in which the number of lanes is 20 and a physical number of signal lines for the SFI transmission and reception signals is 10 can be assumed, and it is only required that (a logical number of lanes) be dividable by (a physical number of signal lines).

Figure 5B:
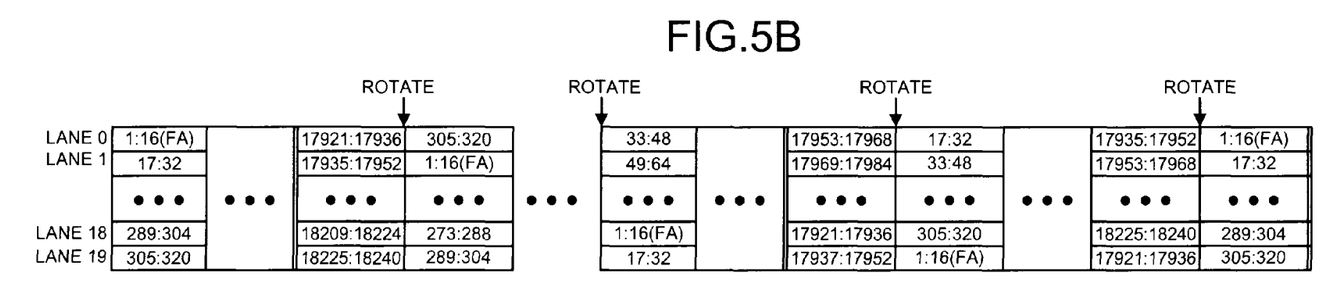

The soft-decision FEC encoders 211 to 21$n$ additionally provide bytes of 16321 to 18240 as a soft-decision FEC redundant area at an end of each lane in each frame period, as shown in FIG. 5B, to independently perform error correction coding for each lane. That is, the soft-decision FEC encoder 211 performs error correction coding for the lane 0, and the soft-decision FEC encoder 212 performs error correction coding for the lane 1. Similarly, the soft-decision FEC encoder 21$n$ (n=20) performs error correction coding for the lane 19.

The multiplexer 220 multiplexes outputs from the soft-decision FEC encoders 211 to 21$n$ according to the number of channels for an optical transmission signal, the D/A converter 230 converts the signal into an analog signal, and the E/O converter 240 converts the analog signal into an optical signal to output an optical transmission signal to the communication channel 2. For the optical transmission signal, there is a method of transmitting multi-bit information in a one-symbol time by combining multilevel modulation, such as quadrature phase shift keying (QPSK), and polarization multiplexing of polarization channels (X polarization and Y polarization) to realize an optical communication system enabling transmission at a high speed and over a long distance, for example. By this method, four kinds of signal components are transmitted by an in-phase component and a quadrature phase component for the multilevel modulation, and X polarization and Y polarization for the polarization multiplexing. In this case, the multiplexer 220 performs multiplexing by relating the signals of 20 lanes to four channels of the in-phase component, the quadrature phase component, the X polarization, and the Y polarization.

On the receiving end, the O/E converter 250 converts the four kinds of signal components of an optical reception signal into an analog signal, and the A/D converter 260 performs quantization to generate soft-decision reception data. The demultiplexer 270 demultiplexes the soft-decision reception data into data corresponding to each of the lanes, and outputs the demultiplexed data to the soft-decision FEC decoders 281 to 28$n$. On the receiving end, however, there are cases that the in-phase component, the quadrature component, the X polarization, and the Y polarization are shuffled at the time of power activation or during the recovering operation of failed transmission channels. In such cases, data at the lane 0 on the transmission end does not reliably appear at the lane 0 on the receiving end, and data at an arbitrary lane is inputted to an arbitrary one of the soft-decision FEC decoders 281 to 28$n$. Therefore, each of the soft-decision FEC decoders 281 to 28$n$ independently verifies FA (Frame Alignment) bytes in each lane, and independently performs error correction decoding for each lane based on a position of the verified FA bytes.

The data subjected to the soft-decision decoding is inputted to the multi-lane synchronizer 103 as the SFI reception signal. The multi-lane synchronizer 103 verifies the FAs in all the lanes to synchronize the lanes, reconstructs the frame configuration as shown in FIG. 5A, and reconstructs the OTUk frame as shown in FIG. 3. The OTUk frame termination unit 104 performs processing of the OH required for maintenance control and/or demapping of a client signal for the reconstructed OTUk frame, and then outputs a client reception signal.

As described above, the multi-lane distributor 102 and the multi-lane synchronizer 103 are provided, and the soft-decision FEC encoders 211 to 21$n$ and the soft-decision FEC decoders 281 to 28$n$ corresponding to each lane are provided. Therefore, even when there is uncertainty in reception channels resulting from phase modulation or polarization multiplexing, the soft-decision error correction decoding can be achieved, and a high-speed and long-distance optical communication system can be realized.

The OTUk framer 10 includes the multi-lane distributor 102 and the multi-lane synchronizer 103, and the digital signal processing optical transceiver 20 includes the soft-decision FEC encoders 211 to 21$n$ and the soft-decision FEC decoders 281 to 28$n$ for each of the lanes. Therefore, a semiconductor integration circuit can be realized in appropriate circuit scale allocation with reduced power.

In the first embodiment, the example in which the number of lanes is 20 and the number of channels for the optical transmission/reception signal is four is described. It is also possible that the number of lanes is four and the number of channels for the optical transmission/reception signal is four, that is, these numbers are the same. Generally, when the number of lanes is n (n is a positive integer), the number of channels is m (m is a positive integer), and a physical number of signal lines for the SFI transmission/reception signal is k (k is a positive integer), it is only required that n be dividable by m (n/m) and n be dividable by k (n/k).

In the first embodiment, interleaving or deinterleaving can be performed as needed at a previous or subsequent stage of each error correction coding process, or during each error correction coding process, to distribute errors occurring in a transmission line during error correction decoding.

Figure 6:
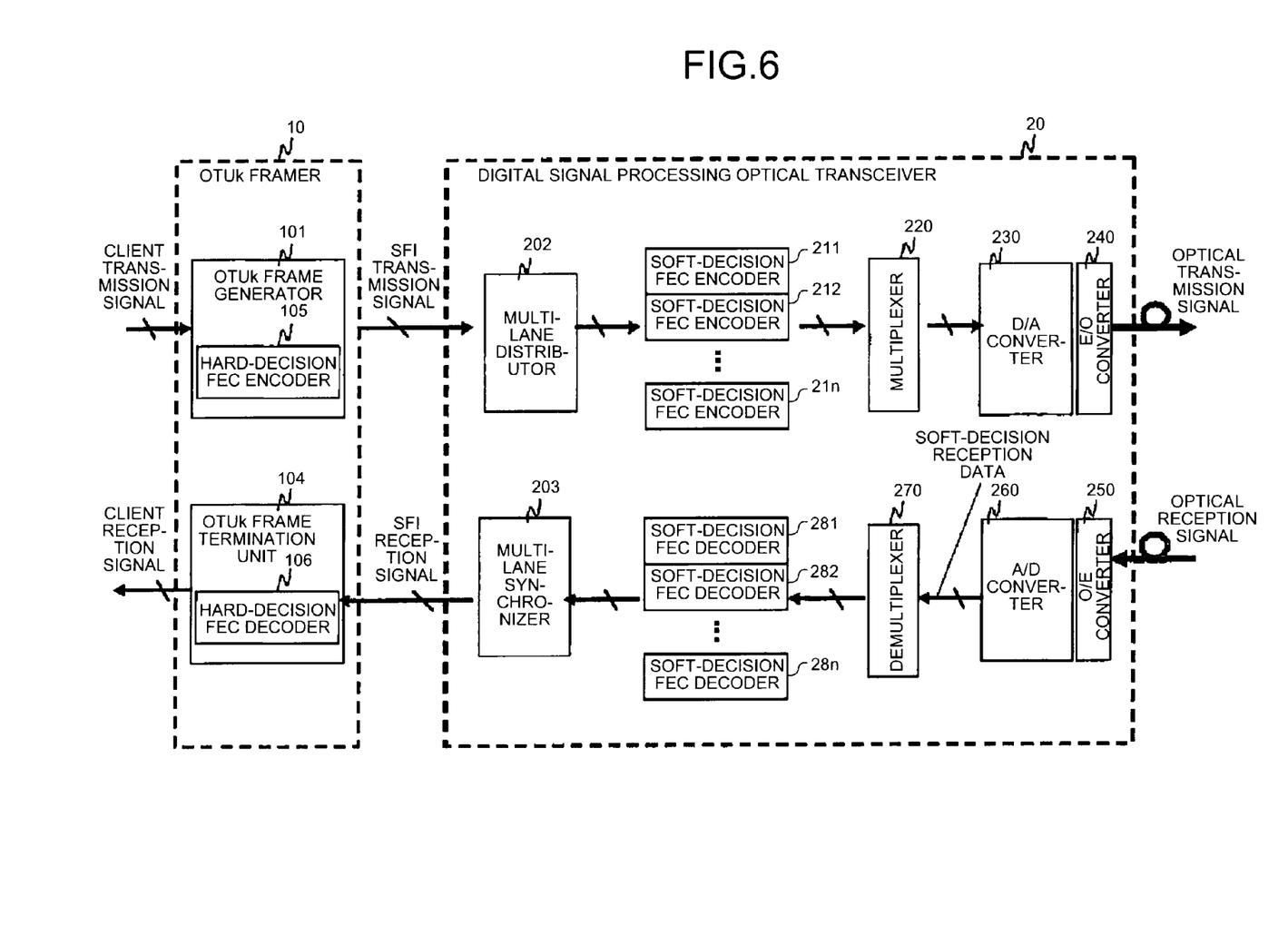
FIG. 6 is a configuration diagram of an FEC frame structuring device according to a second embodiment of the present invention.

In the first embodiment, the multi-lane distributor 102 and the multi-lane synchronizer 103 are provided in the OTUk framer 10. An embodiment in which a multi-lane distributor 202 and a multi-lane synchronizer 203 are provided in the digital signal processing optical transceiver 20 as shown in FIG. 6 is explained as a second embodiment of the present invention. Configurations and operations of the second embodiment are the same as those of the first embodiment except for a configuration and an operation related to the multi-lane distributor and the multi-lane synchronizer. With this configuration, the number of lanes can be selected independently of the number of signal lines for the SFI transmission signal and the SFI reception signal. When four channels for the in-phase component, the quadrature phase component, the X polarization, and the Y polarization are required to modulate or demodulate optical transmission/reception signals, for example, it can be assumed that the number of lanes is four (n=4). When the number of lanes is reduced, increases in circuit scales of the multi-lane distributor 202, the multi-lane synchronizer 203, the soft-decision FEC encoders 211 to 21$n$, and the soft-decision FEC decoders 281 to 28$n$ can be reduced.

In the second embodiment, the example in which the number of lanes is four and the number of channels for the optical transmission/reception signal is four is described. However, generally, when the number of lanes is n and the number of channels is m, it is required that n be dividable by m (n/m).

Figure 7:
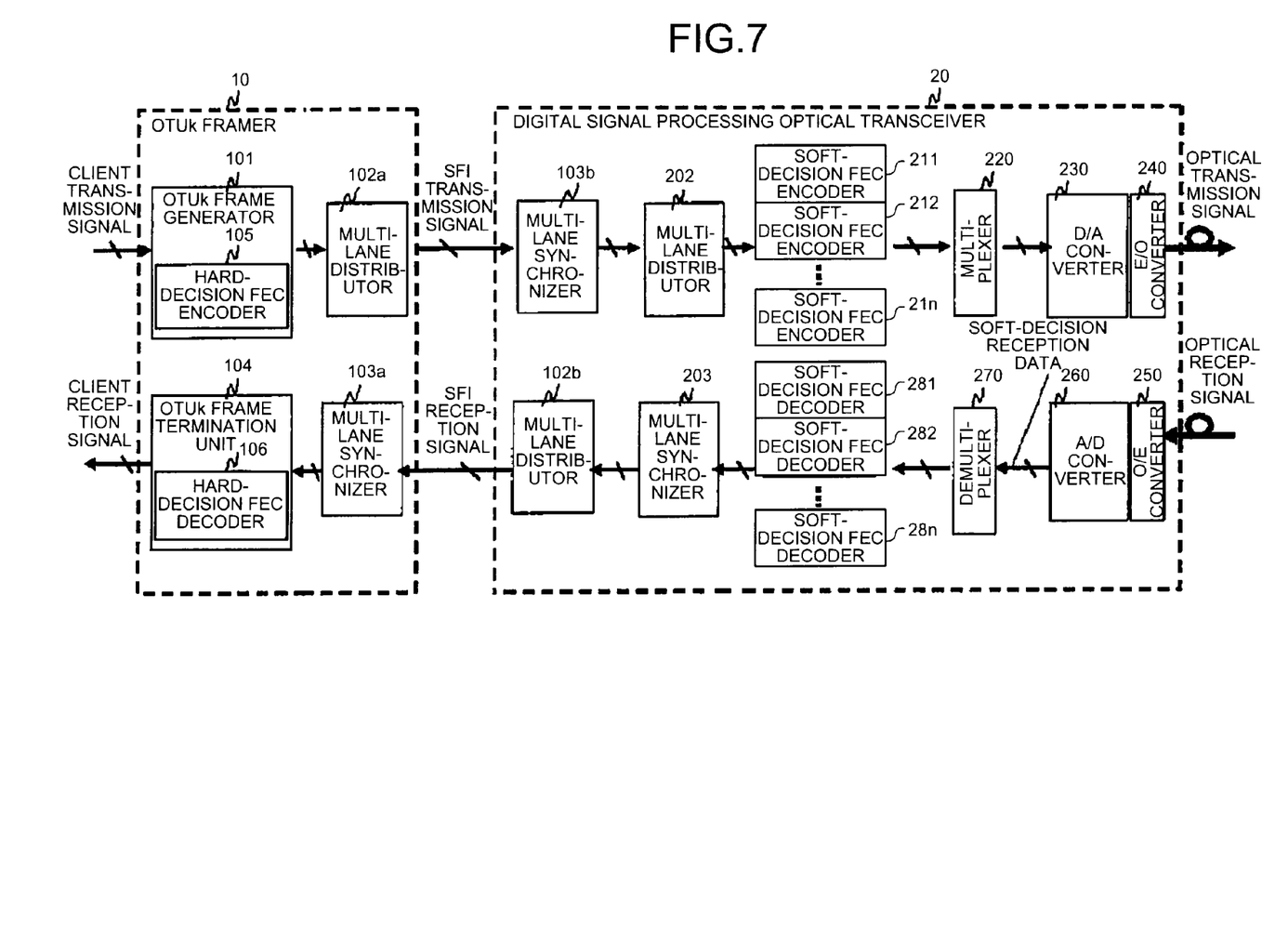
FIG. 7 is another configuration diagram of the FEC frame structuring device according to the second embodiment.

When phase correction between lanes is required for the SFI transmission signal and the SFI reception signal exchanged between the OTUk framer 10 and the digital signal processing optical transceiver 20, multi-lane distributors 102a and 102b and multi-lane synchronizers 103a and 103b are additionally provided as shown in FIG. 7. It is also possible to provide a configuration that uses another phase correcting method for the SFI transmission/reception signals instead of the multi-lane distributors 102a and 102b and the multi-lane synchronizers 103a and 103b.

Figure 8:
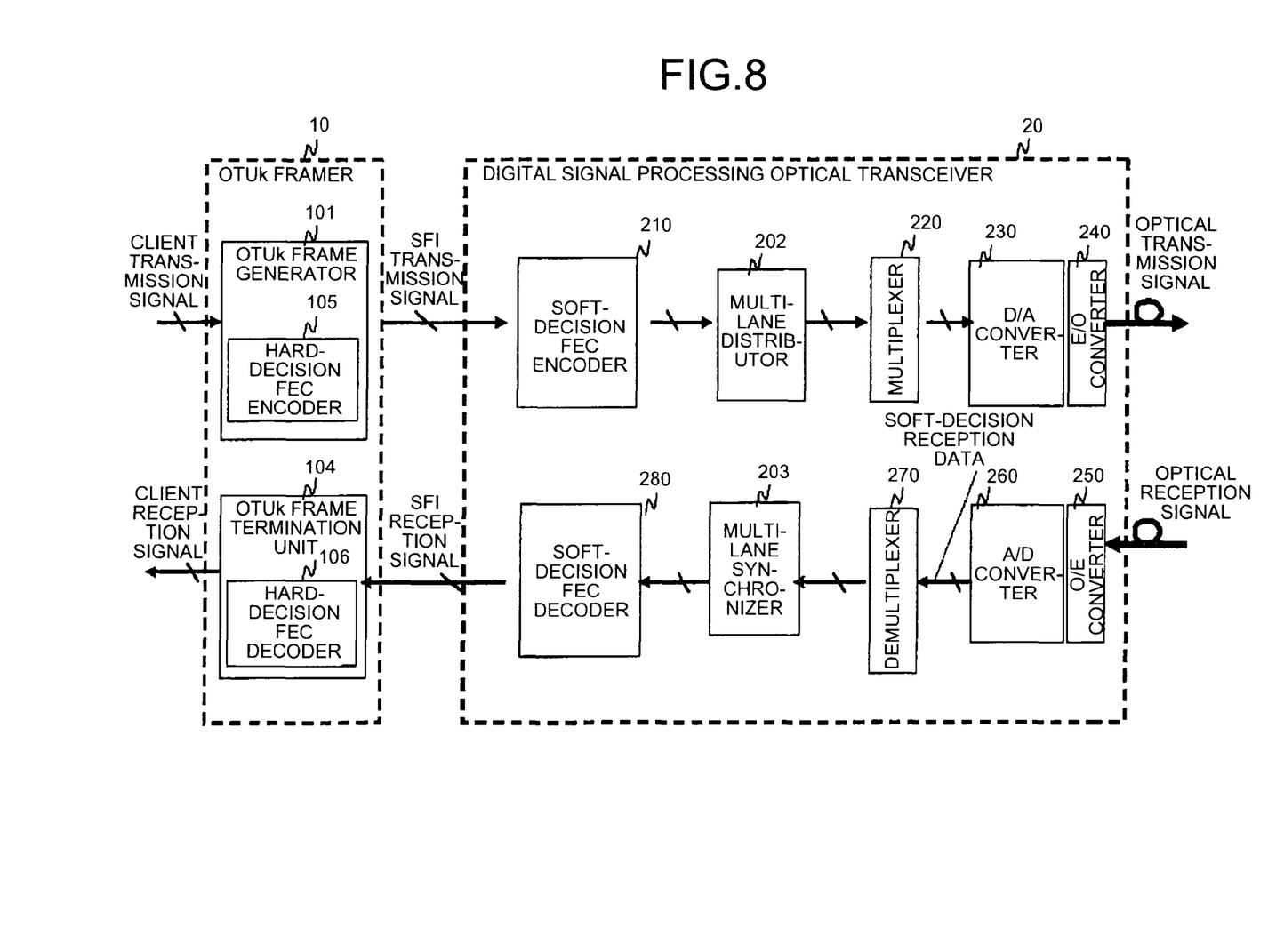
FIG. 8 is a configuration diagram of an FEC frame structuring device according to a third embodiment of the present invention.

In the first and second embodiments, the OTUk frame is distributed to multiple lanes and then the soft-decision FEC coding and decoding is performed for each of the lanes. An embodiment in which the multi-lane distributor 202 is provided at a subsequent stage of a soft-decision FEC encoder 210, and the multi-lane synchronizer 203 is provided at a previous stage of a soft-decision FEC decoder 280 as shown in FIG. 8 is explained as a third embodiment of the present invention. Configurations and operations of the third embodiment are the same as those of the first embodiment except for a configuration and an operation related to the soft-decision FEC encoder, the soft-decision decoder, the multi-lane distributor, and the multi-lane synchronizer.

The soft-decision FEC encoder 210 performs error correction coding of a frame that is obtained by additionally providing a soft-decision FEC redundant area to an OTUk frame, and then the multi-lane distributor 202 distributes lanes to the number of optical channels. On the receiving end, the multi-lane synchronizer 203 corrects uncertainty in lane positions or phases among the lanes occurred in a reception signal, and reconstructs a frame configuration including the soft-decision FEC redundant area additionally provided to the OTUk frame. The soft-decision FEC decoder 280 then performs soft-decision decoding for error correction. For example, in a case in which four channels for the in-phase component, the quadrature phase component, the X polarization, and the Y polarization are used during modulation or demodulation of an optical transmission/reception signal, the frame may be distributed to four lanes (n=4). As described above, even when there is uncertainty in reception channels resulting from phase modulation or polarization multiplexing, the soft-decision error correction decoding can be performed, and a high-speed and long-distance optical communication system can be realized.

In the third embodiment, the example in which the number of lanes is four and the number of channels for the optical transmission/reception signal is four is described. However, generally, when the number of lanes is n and the number of channels is m, then it is required that n be dividable by m (n/m).

Figure 9:
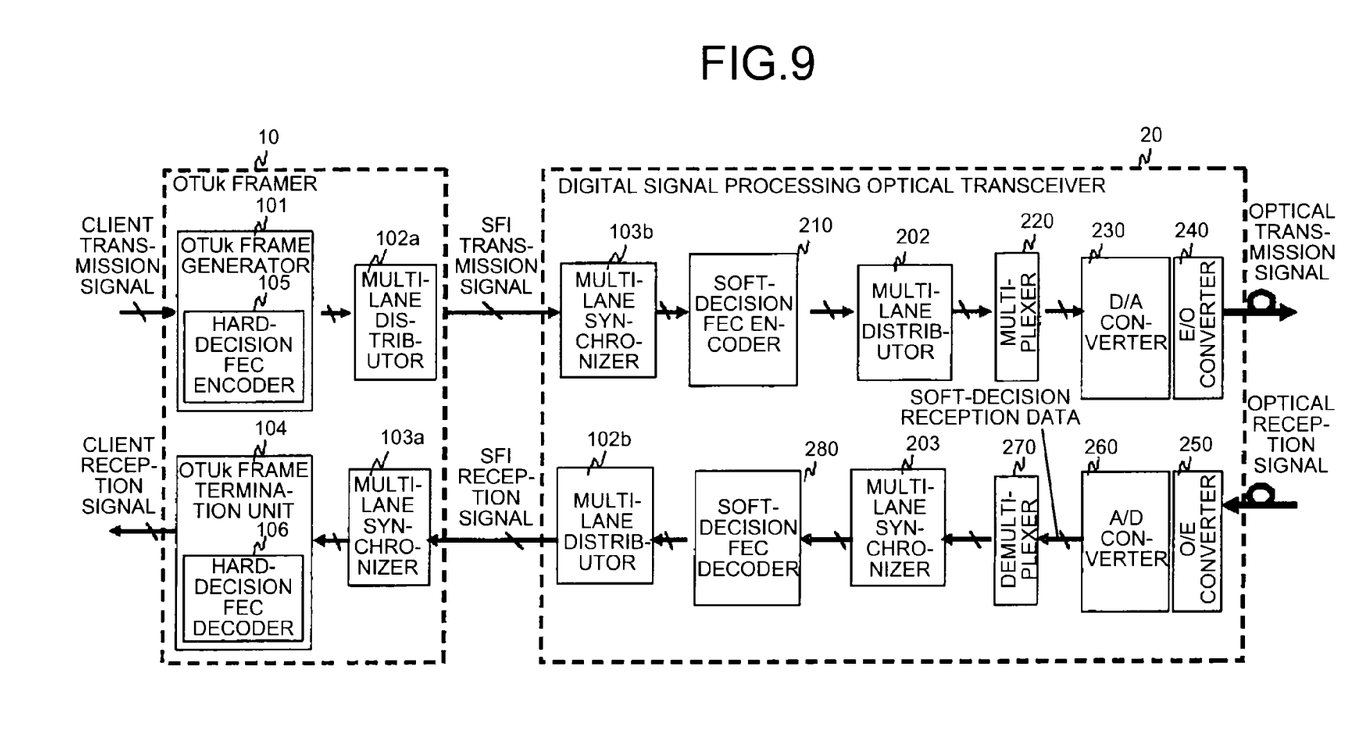
FIG. 9 is another configuration diagram of the FEC frame structuring device according to the third embodiment.

When correction of phases among lanes is required in the SFI transmission signal and the SFI reception signal exchanged between the OTUk framer 10 and the digital signal processing optical transceiver 20, the multi-lane distributors 102a and 102b and the multi-lane synchronizers 103a and 103b may be additionally provided as shown in FIG. 9. It is also possible to provide a configuration that uses another phase correcting method for the SFI transmission/reception signals instead of the multi-lane distributors 102a and 102b and the multi-lane synchronizers 103a and 103b.

In the first and second embodiments, the example in which the FEC coding and decoding processes are performed for each lane is described. However, the same operational effect is of course obtained by handling plural lanes that do not cause a phase difference between lanes or interchange of lanes, as a group of lanes, and performing FEC coding and decoding for each group in the same configuration as that in the first or second embodiment.

According to the present invention, optical interface including plural lanes can be handled and an unnecessary increase in the processing speed that can be a factor of deteriorated transmission characteristics can be avoided in an FEC frame structuring device, and a high-quality and high-speed optical communication system can be provided.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An FEC (Forward Error Correction) frame structuring device in an optical communication system that transmits or receives an FEC frame structured by adding an FEC code to a data frame including information data and an overhead as an optical signal, the FEC frame structuring device comprising:
   a multi-lane distributing unit that distributes a data frame to be transmitted to n (n is a positive integer) lanes;
   n FEC coding units, one for each of the n lanes, each of which performs FEC coding of the data frame distributed by the multi-lane distributing unit independently for each of the n lanes to generate an FEC frame;
   a multiplexing unit that multiplexes the FEC frame from the n FEC coding units to m (m is a positive integer) channels for the optical signal;
   a demultiplexing unit that demultiplexes the m channels of the received optical signal to the n lanes;
   n FEC decoding units, one for each of the n lanes, each of which performs FEC decoding of the FEC frame demultiplexed by the demultiplexing unit independently for each of the n lanes; and
   a multi-lane synchronizing unit that synchronizes the n lanes with each other after the FEC decoding performed by the n FEC decoding units to reconstruct the original data frame,
   wherein n is dividable by m.

2. The FEC frame structuring device according to claim 1, wherein the data frame is an optical channel transport unit-k (OTUk) frame.

3. The FEC frame structuring device according to claim 2, wherein the multi-lane distributing unit and the multi-lane synchronizing unit are implemented in an OTUk framer, and the FEC coding unit and the FEC decoding unit are implemented in an optical transceiver.

4. The FEC frame structuring device according to claim 1, wherein n is 20 and m is 4.

5. The FEC frame structuring device according to claim 4, wherein the channels for the optical signal correspond to an in-phase component and a quadrature phase component for multilevel modulation, and X polarization and Y polarization for polarization multiplexing.

6. The FEC frame structuring device according to claim 1, wherein n is 4 and m is 4.

7. The FEC frame structuring device according to claim 6, wherein the channels for the optical signal correspond to an in-phase component and a quadrature phase component for multilevel modulation, and X polarization and Y polarization for polarization multiplexing.

8. The FEC frame structuring device according to claim 1, wherein the multi-lane distributing unit, the multi-lane synchronizing unit, the FEC coding unit, and the FEC decoding unit are implemented in an optical transceiver.

9. An FEC frame structuring device in an optical communication system that transmits or receives an FEC frame structured by adding an FEC code to an OTUk frame including information data and an overhead as an optical signal, the FEC frame structuring device comprising:
- an FEC coding unit that performs FEC coding of the OTUk frame to be transmitted by providing an additional redundant area added thereto, to generate the FEC frame;
- a multi-lane distributing unit that distributes the FEC frame generated by the FEC coding unit to n (n is an integer greater than 1) lanes;
- a multiplexing unit that multiplexes the FEC frame distributed to the n lanes by the multi-lane distributing unit to m (m is an integer greater than 1) channels for the optical signal;
- a demultiplexing unit that demultiplexes the m channels for the received optical signal to the n lanes;
- a multi-lane synchronizing unit that synchronizes the n lanes demultiplexed by the demultiplexing unit to reconstruct the FEC frame; and
- an FEC decoding unit that performs FEC decoding of the FEC frame reconstructed by the multi-lane synchronizing unit, wherein
- n is dividable by m.

10. The FEC frame structuring device according to claim 9, wherein n is 4 and m is 4.

11. The FEC frame structuring device according to claim 10, wherein the channels for the optical signal correspond to an in-phase component and a quadrature phase component for multilevel modulation, and X polarization and Y polarization for polarization multiplexing.

12. A method of structuring an FEC (Forward Error Correction) frame in an optical communication system that transmits or receives an FEC frame structured by adding an FEC code to a data frame including information data and an overhead as an optical signal, the FEC frame structuring device comprising:
- multi-lane distributing for distributing a data frame to be transmitted to n (n is a positive integer) lanes;
- FEC coding the data frame distributed at the multi-lane distributing step independently for each of the n lanes, using n FEC coding units, to generate an FEC frame;
- multiplexing the FEC frame from the n FEC coding units to m (m is a positive integer) channels for the optical signal;
- demultiplexing the m channels of the received optical signal to the n lanes;
- FEC decoding the FEC frame demultiplexed at the demultiplexing step independently for each of the n lanes using n FEC decoding units; and
- multi-lane synchronizing for synchronizing the n lanes after the FEC decoding performed at the FEC decoding step to reconstruct the original data frame, wherein
- n is dividable by m.

13. An FEC frame structuring method applied in an optical communication system that transmits or receives an FEC frame structured by adding an FEC code to an OTUk frame including information data and an overhead as an optical signal, the FEC frame structuring method comprising:
- performing FEC coding of the OTUk frame to be transmitted by providing an additional redundant area added thereto, to generate the FEC frame;
- distributing the FEC frame generated at the FEC coding to n (n is an integer greater than 1) lanes;
- multiplexing the FEC frame distributed to the n lanes at the distributing to m (m is an integer greater than 1) channels for the optical signal;
- demultiplexing the m channels for the received optical signal to the n lanes;
- synchronizing the n lanes demultiplexed at the demultiplexing to reconstruct the FEC frame; and
- performing FEC decoding of the FEC frame reconstructed at the synchronizing, wherein
- n is dividable by m.

* * * * *